United States Patent
Wengler

(10) Patent No.: US 7,826,917 B2
(45) Date of Patent: Nov. 2, 2010

(54) METHOD AND SYSTEM FOR LAYING OUT PERFORATION PATTERNS

(75) Inventor: George Wengler, North Ridgeville, OH (US)

(73) Assignee: USG Interiors, Inc., Chicago, IL (US)

(*) Notice: Subject to any disclaimer, the term of this patent is extended or adjusted under 35 U.S.C. 154(b) by 150 days.

(21) Appl. No.: 11/756,314

(22) Filed: May 31, 2007

(65) Prior Publication Data

US 2008/0301572 A1    Dec. 4, 2008

(51) Int. Cl.
*G06F 17/50* (2006.01)
*G06F 19/00* (2006.01)

(52) U.S. Cl. ............................. 700/182; 700/180; 703/1
(58) Field of Classification Search ................... 700/97, 700/98, 159, 180, 182; 703/1, 5–7
See application file for complete search history.

(56) References Cited

U.S. PATENT DOCUMENTS

| | | | | |
|---|---|---|---|---|
| 4,933,865 A * | 6/1990 | Yamamoto et al. | ........... | 700/182 |
| 5,365,705 A * | 11/1994 | Crowley et al. | ............... | 52/90.1 |
| 5,505,035 A * | 4/1996 | Lalvani | ....................... | 52/648.1 |
| 5,640,812 A * | 6/1997 | Crowley et al. | ............... | 52/90.1 |
| 5,803,964 A * | 9/1998 | Scarborough | ............... | 106/724 |
| 6,112,133 A | 8/2000 | Fishman | | |
| 6,134,860 A * | 10/2000 | Pagano et al. | ............... | 52/745.1 |
| 6,374,564 B1 | 4/2002 | Fletterick et al. | | |
| 6,631,603 B2 * | 10/2003 | Zornes | ....................... | 52/782.1 |
| 2002/0069603 A1 * | 6/2002 | Zornes | ......................... | 52/612 |
| 2004/0221529 A1 * | 11/2004 | Zornes | ....................... | 52/311.1 |
| 2005/0044133 A1 * | 2/2005 | Hashimoto et al. | .......... | 700/182 |
| 2006/0003144 A1 * | 1/2006 | Kaump | ......................... | 428/131 |
| 2006/0031058 A1 * | 2/2006 | Roelofs | ......................... | 703/22 |
| 2006/0217941 A1 | 9/2006 | Soteros | | |
| 2007/0261318 A1 * | 11/2007 | Mifsud et al. | ................. | 52/79.1 |
| 2007/0262040 A1 * | 11/2007 | Mifsud et al. | ................ | 212/324 |
| 2007/0264107 A1 * | 11/2007 | Mifsud et al. | ................ | 414/296 |
| 2007/0265724 A1 * | 11/2007 | Mifsud et al. | ................ | 700/115 |
| 2007/0271073 A1 * | 11/2007 | Mifsud et al. | .................. | 703/1 |
| 2007/0271870 A1 * | 11/2007 | Mifsud et al. | .............. | 52/745.2 |

* cited by examiner

*Primary Examiner*—Charles R Kasenge
(74) *Attorney, Agent, or Firm*—Pradip K. Sahu; Philip T. Petti; Leydig, Voit & Mayer, Ltd.

(57) ABSTRACT

A method and system for automating the layout of perforation patterns is described. An embodiment of the invention includes an innovative software application running on a computer, which application allows a perforation designer to select lines or arcs that comprise edges of a building panel. The application determines a starting hole spacing based on the average distance through the geometric center of the panel, and a default perforation pattern is laid out on a computer aided drawing. The application provides the user with detailed information about the perforation layout such as number of perforations, panel area, and percentage of open area. The application further allows the user to change any parameter such as hole size, hole spacing, hole shape, and edge spacing. After any user adjustment of the parameters, the application automatically updates the perforation pattern.

20 Claims, 11 Drawing Sheets

METHOD AND SYSTEM FOR LAYING OUT PERFORATION PATTERNS

BACKGROUND OF THE INVENTION

Modern architecture and construction allow architects and developers to combine functional components of a building with its aesthetic value. One such component is the building panel systems found in both commercial and residential developments. The imaginations of both the architect and developer have made building panels more complex, in shape and texture, particularly when compared with conventional flat and square building panels. Specialty building panel systems may contain arcs and curves rather than straight edges.

Specialty building panel systems may require perforation patterns for functional or aesthetic reasons. The functional value of perforations includes sound absorption, fire retardation, EMI/RF attenuation, increased air flow and light diffusion. The arrangement of perforations in various patterns or shapes may also cause a visually pleasing effect.

In an acoustically sensitive setting such as a manufacturing facility, auditorium, or music studio, the capacity of building panels to absorb sound is a key consideration. Such building panels serve, for example, to deaden the sound of machines, minimize spurious noise for sensitive sound recording, and decrease sound transmission between rooms. Some perforated building panel systems can be designed to absorb selective sounds contained within a certain band of frequencies. Various perforation patterns are used to achieve acoustic absorption while minimizing panel weight and space.

In both commercial and residential developments, perforation patterns of building panel systems prevent flame spread, which in turn enhances fire safety. Further, perforation patterns can attenuate electromagnetic interference and radio frequency radiation. This is valuable in commercial developments containing EMI/RF sensitive equipment. In addition, building perforations can provide an architect or developer the ability to diffuse both air and light. Perforations provide a means of straightening and directing fluid in ducts.

Traditionally, designers and manufacturers of building panel systems lay out perforation patterns through a tedious manual method. For example, a perforation designer must evaluate a drawing of a panel and then manually determine where best to place perforations on the panel shape. The designer typically lays out construction lines and arcs on the panel drawing and inserts perforation holes where they intersect. This manual method is inefficient, time consuming, and often inaccurate. The inability to determine an appropriate perforation pattern can even require an architect to adjust the design to fit the perforation pattern, thereby decreasing the functional and aesthetic value of the original design. Further, any change to any parameter of the perforation pattern, such as hole spacing or hole size, requires additional tedious and time consuming calculations.

BRIEF SUMMARY OF THE INVENTION

A method and system for automating the layout of perforation patterns is described. An embodiment of the invention includes a software application running on a computer. The software application allows a perforation designer to select lines or arcs that comprise edges of a building panel. The application determines a starting hole spacing based on the average distance through the geometric center of the panel. A default perforation pattern is laid out on a computer aided drawing. The application provides the user with detailed information about the perforation layout such as number of perforations, panel area, and percentage of open area. The application further allows the user to change any parameter such as hole size, hole spacing, hole shape, and edge spacing. After any user adjustment of the parameters, the application automatically updates the perforation pattern.

BRIEF DESCRIPTION OF THE SEVERAL VIEWS OF THE DRAWING(S)

Figure 11A:
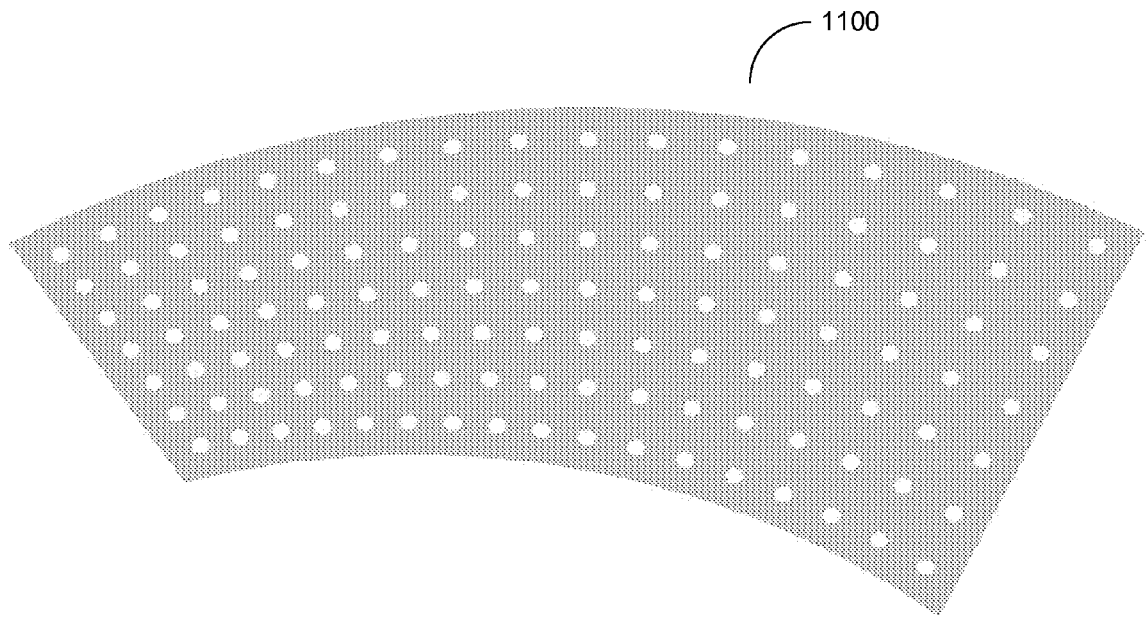
Figure 11B:
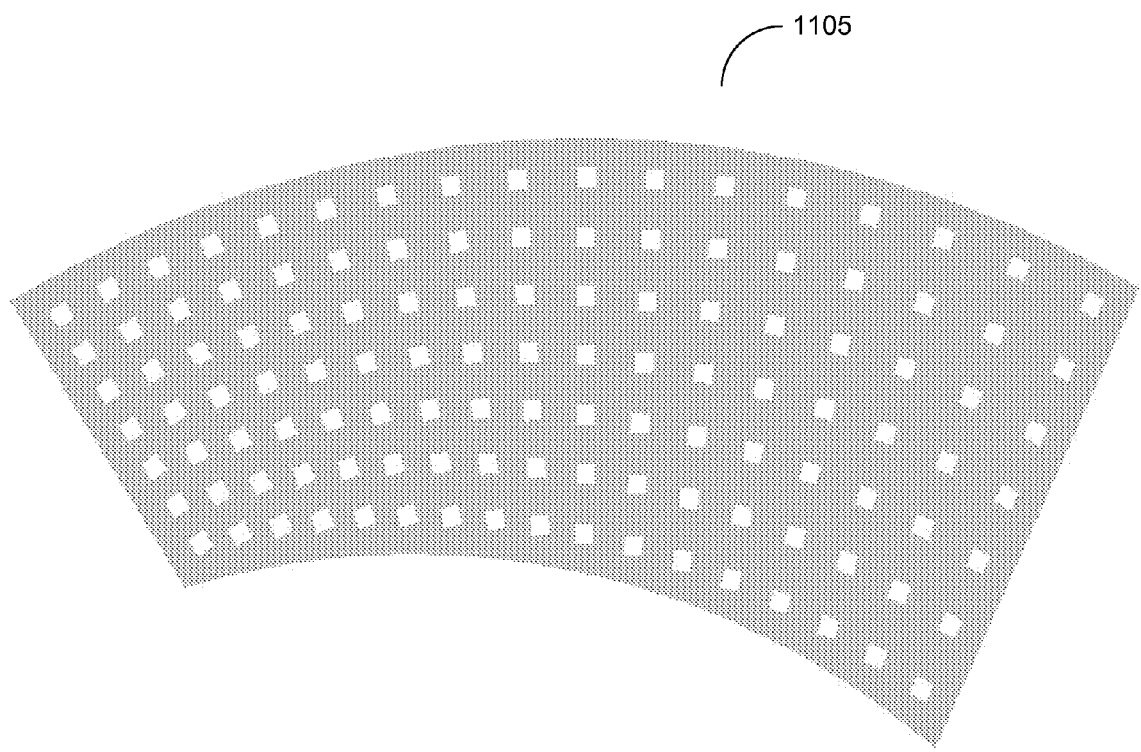

FIGS. 11A-B are exemplary perforation patterns that can be laid out using the perforation application.

DETAILED DESCRIPTION OF THE INVENTION

Turning to the drawings, wherein like reference numerals refer to like elements, the invention is illustrated as being implemented in a suitable computing environment. Although not required, the invention will be described in the general context of computer-executable instructions, such as program modules, being executed by a personal computer. Generally, program modules include routines, programs, objects, components, data structures, etc. that perform particular tasks or implement particular abstract data types. Moreover, those skilled in the art will appreciate that the invention may be practiced with other computer system configurations, including hand-held devices, multi-processor systems, microprocessor based or programmable consumer electronics, network PCs, minicomputers, mainframe computers, and the like.

Figure 1:
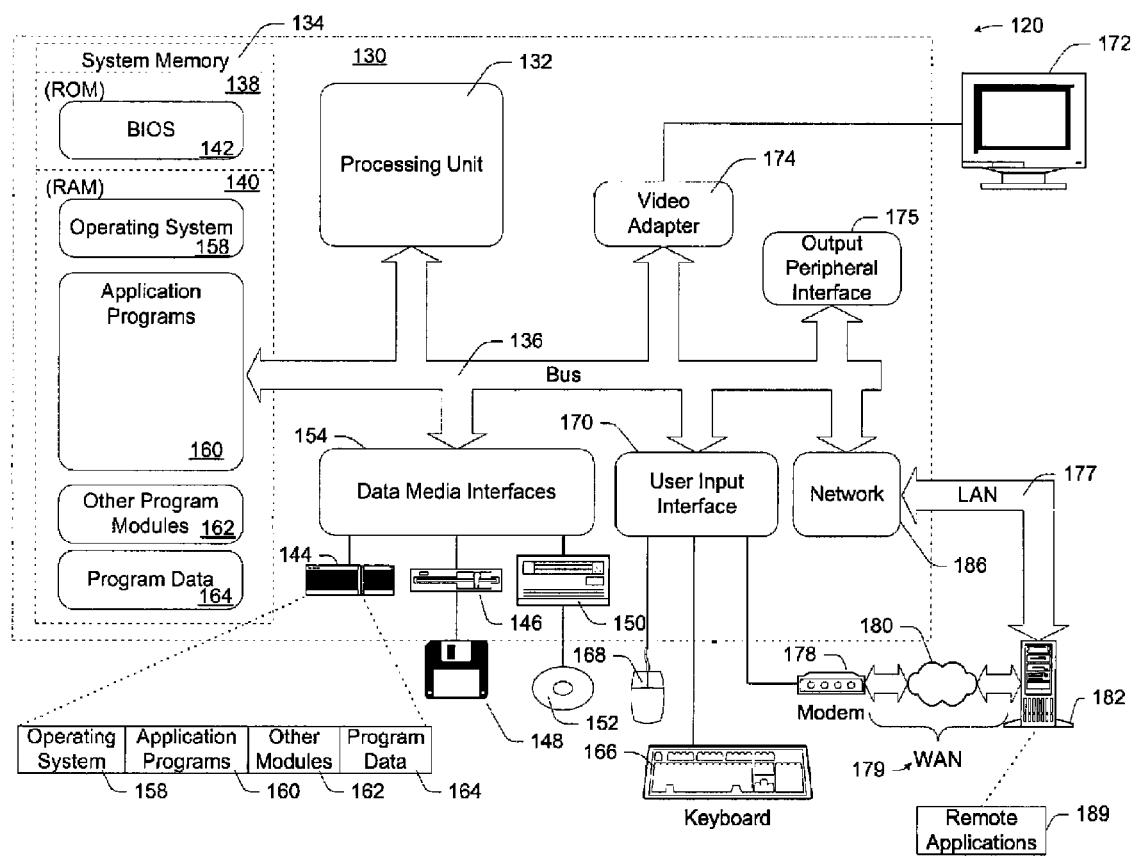
FIG. 1 is a block diagram generally illustrating an exemplary computer system suitable for use with certain implementations of the present invention.

FIG. 1 illustrates an example of a suitable computing environment 120 on which the subsequently described methods and apparatuses may be implemented. Exemplary computing environment 120 is only one example of a suitable computing environment and is not intended to suggest any limitation as to the scope of use or functionality of the improved methods and systems described herein. Neither should computing environment 120 be interpreted as having any dependency or requirement relating to any one or combination of components illustrated in computing environment 120.

The improved methods and apparatuses herein are operational with numerous other general purpose or special purpose computing system environments or configurations. Examples of well known computing systems, environments, and/or configurations that may be suitable include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, distributed computing environments that include any of the above systems or devices, and the like.

As shown in FIG. 1, computing environment 120 includes a general-purpose computing device in the form of a computer 130. The components of computer 130 may include one or more processors or processing units 132, a system memory 134, and a bus 136 that couples various system components including system memory 134 to processor 132.

Bus 136 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus also known as Mezzanine bus.

Computer 130 typically includes a variety of computer readable media. Such media may be any available media that is accessible by computer 130, and it includes both volatile and non-volatile media, removable and non-removable media.

In FIG. 1, system memory 134 includes computer readable media in the form of volatile memory, such as random access memory (RAM) 140, and/or non-volatile memory, such as read only memory (ROM) 138. A basic input/output system (BIOS) 142, containing the basic routines that help to transfer information between elements within computer 130, such as during start-up, is stored in ROM 138. RAM 140 typically contains data and/or program modules that are immediately accessible to and/or presently being operated on by processor 132.

Computer 130 may further include other removable/non-removable, volatile/non-volatile computer storage media. For example, FIG. 1 illustrates a hard disk drive 144 for reading from and writing to a non-removable, non-volatile magnetic media (not shown and typically called a "hard drive"), a magnetic disk drive 146 for reading from and writing to a removable, non-volatile magnetic disk 148 (e.g., a "floppy disk"), and an optical disk drive 150 for reading from or writing to a removable, non-volatile optical disk 152 such as a CD-ROM/R/RW, DVD-ROM/R/RW/+R/RAM or other optical media. Hard disk drive 144, magnetic disk drive 146 and optical disk drive 150 are each connected to bus 136 by one or more interfaces 154.

The drives and associated computer-readable media provide nonvolatile storage of computer readable instructions, data structures, program modules, and other data for computer 130. Although the exemplary environment described herein employs a hard disk, a removable magnetic disk 148 and a removable optical disk 152, it should be appreciated by those skilled in the art that other types of computer readable media which can store data that is accessible by a computer, such as magnetic cassettes, flash memory cards, digital video disks, random access memories (RAMs), read only memories (ROM), and the like, may also be used in the exemplary operating environment.

A number of program modules may be stored on the hard disk, magnetic disk 148, optical disk 152, ROM 138, or RAM 140, including, e.g., an operating system 158, one or more application programs 160, other program modules 162, and program data 164.

The improved methods and systems described herein may be implemented within operating system 158, one or more application programs 160, other program modules 162, and/or program data 164.

A user may provide commands and information into computer 130 through input devices such as keyboard 166 and pointing device 168 (such as a "mouse"). Other input devices (not shown) may include a microphone, joystick, game pad, satellite dish, serial port, scanner, camera, etc. These and other input devices are connected to the processing unit 132 through a user input interface 170 that is coupled to bus 136, but may be connected by other interface and bus structures, such as a parallel port, game port, or a universal serial bus (USB).

A monitor 172 or other type of display device is also connected to bus 136 via an interface, such as a video adapter 174. In addition to monitor 172, personal computers typically include other peripheral output devices (not shown), such as speakers and printers, which may be connected through output peripheral interface 175. Video adapter 174 typically includes a video graphics device.

Computer 130 may operate in a networked environment using logical connections to one or more remote computers, such as a remote computer 182. Remote computer 182 may include many or all of the elements and features described herein relative to computer 130.

Logical connections shown in FIG. 1 are a local area network (LAN) 177 and a general wide area network (WAN) 179. Such networking environments are commonplace in offices, enterprise-wide computer networks, intranets, and the Internet.

When used in a LAN networking environment, computer 130 is connected to LAN 177 via network interface or adapter 186. When used in a WAN networking environment, the computer typically includes a modem 178 or other means for establishing communications over WAN 179. Modem 178, which may be internal or external, may be connected to system bus 136 via the user input interface 170 or other appropriate mechanism.

Depicted in FIG. 1, is a specific implementation of a WAN via the Internet. Here, computer 130 employs modem 178 to establish communications with at least one remote computer 182 via the Internet 180.

In a networked environment, program modules depicted relative to computer 130, or portions thereof, may be stored in a remote memory storage device. Thus, e.g., as depicted in FIG. 1, remote application programs 189 may reside on a memory device of remote computer 182. It will be appreciated that the network connections shown and described are exemplary and other means of establishing a communications link between the computers may be used.

An embodiment of the invention provides a perforation software application to run within a computer aided design program in a computer environment 120 depicted in FIG. 1. An example of a computer aided design program is AutoCAD, but the invention is not limited to only such a program. Further, the perforation software application implemented using Visual Basic Application (VBA) as described in the exemplary embodiments may use any software compatible with a computer aided design program. The preferred embodiment of invention describes the perforation software application implemented in VBA and the computer aided design program to be AutoCAD. Further, the preferred embodiment lays the perforation patterns onto ceiling panel systems. However, the invention is not limited to this embodiment.

Figure 2:
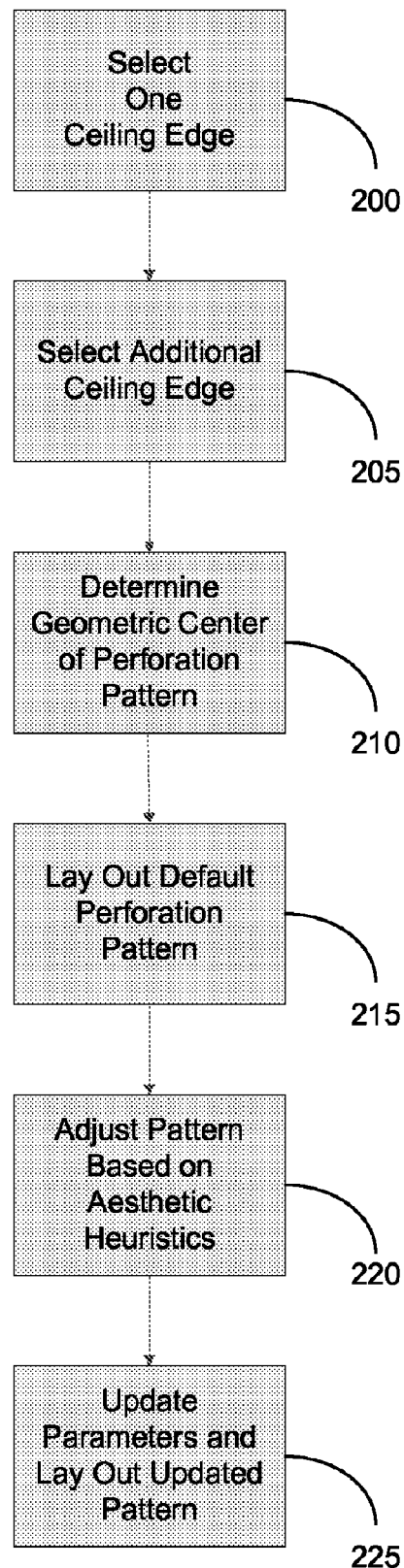
FIG. 2 is a flow diagram illustrating a method of an exemplary embodiment of the invention illustrating the steps in laying out a perforation pattern on a building panel.

FIG. 2 is a flow diagram illustrating the top level steps of a method of an exemplary embodiment of the invention. At step 200, a user selects an AutoCAD object that represents an edge of a ceiling shape. At step 205, a user selects an AutoCAD object that represents an additional edge of the ceiling shape. The application provides the user with an option to offset the perforation pattern from an edge by a certain distance. At step 210, the perforation application locates the geometric center for the perforations of a panel by intersecting the connecting lines between the start and end of each segment of the edges. This gives a perforation pattern that is located on radials if the ceiling edges are arcs rather than straight lines. If the connecting lines happen to be parallel then the perforation array is also parallel. At step 215, the perforation application lays out a default perforation pattern. If the ceiling edges are arcs, the perforation pattern is located in a parallel radial pattern. The application lays out the radial perforation pattern such that the pattern is closely square to the middle of the ceiling. At step 220, the application adjusts the perforation pattern such that there is no odd spacing at the ceiling edge. The application iterates this function until the spacing reaches a pleasing aesthetic. At step 225, the perforation application allows the user to change the parameters of the perforation patterns such as hole size, hole spacing, hole shape, and edge spacing. Once the parameters are changed, the application updates the perforation pattern automatically.

Figure 3:
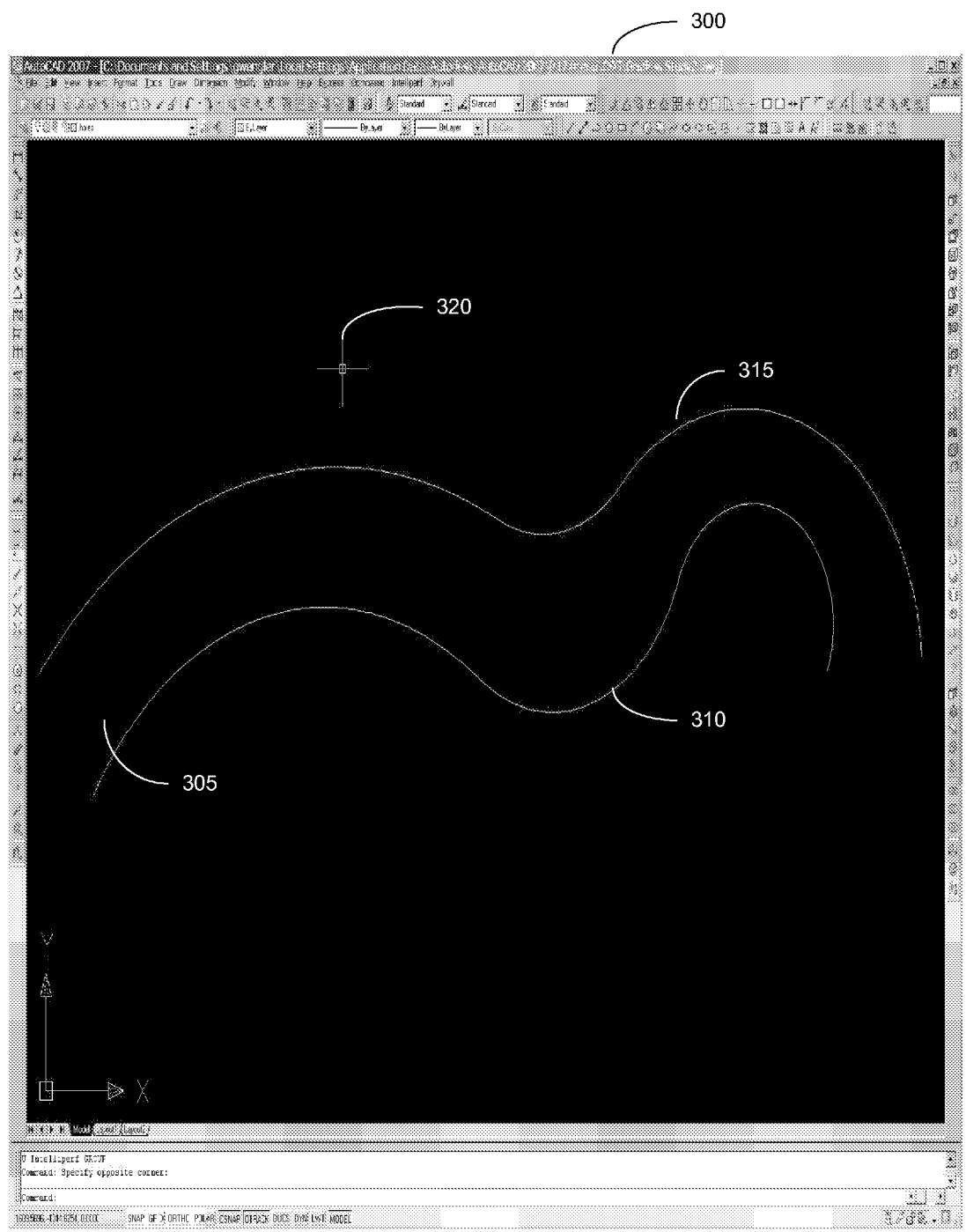
FIG. 3 is an exemplary user interface, in accordance with an embodiment of the invention illustrating a ceiling shape.

FIGS. 3-7 are exemplary user interfaces, in accordance with an embodiment of the invention. In addition, FIGS. 3-7 correspond to some of the steps depicted in FIG. 2. FIG. 3 illustrates a screen shot of the AutoCAD software environment 300. The AutoCAD program opens an AutoCAD drawing file containing a ceiling shape 305. The ceiling shape contains ceiling edges that are arc segments (310, 315). The crosshair cursor 320 allows the user to select a ceiling edge segment 310 and an additional ceiling edge segment 315. As discussed when describing FIG. 2, once the user selects two ceiling edge segments, the perforation application locates the geometric center of the perforation pattern by intersecting the connecting lines between the start and end of each segment of the edges. Thus, when the ceiling edge segments are arcs as in FIG. 3, the perforation pattern is located on radials. In addition, if the connecting lines are parallel as in the case of the ceiling shape in FIG. 3, then the perforation array is also parallel.

Figure 4:
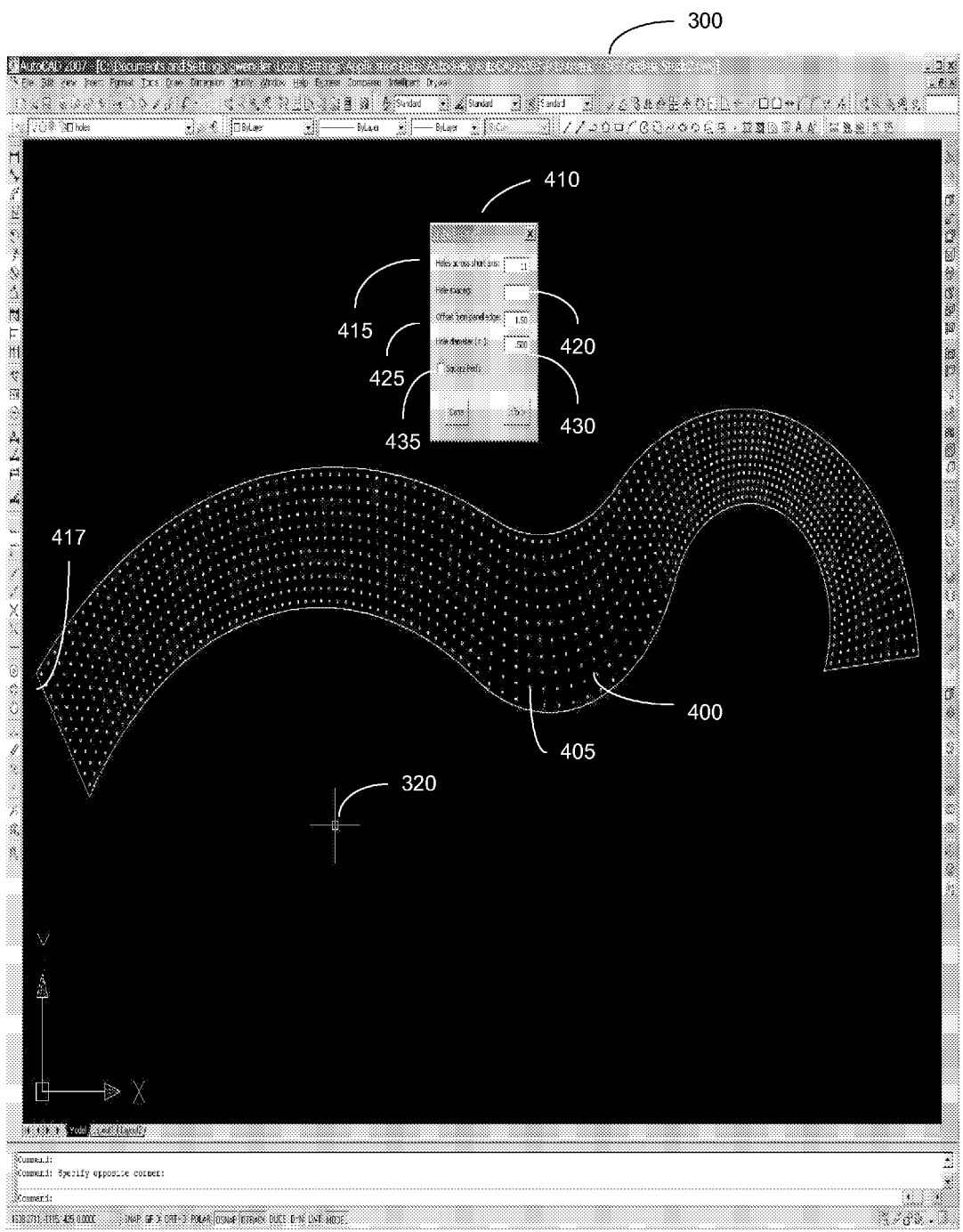
FIG. 4 is an exemplary user interface, in accordance with an embodiment of the invention illustrating laying out a perforation pattern using a perforation software application.

FIG. 4 illustrates the perforation application laying out a default perforation pattern 400. The perforation pattern places radial perforation patterns such that they are closely square in the middle of the ceiling 405. The perforation application provides a dialog box 410 that reports the number of perforation holes 415 along the short axis 417 of the ceiling shape 405. In addition, the dialog box 410 reports the hole spacing 420, panel edge offset 425, and hole diameter 430. Further, the perforation application reports to the user whether the holes are square or round 435.

Figure 5:
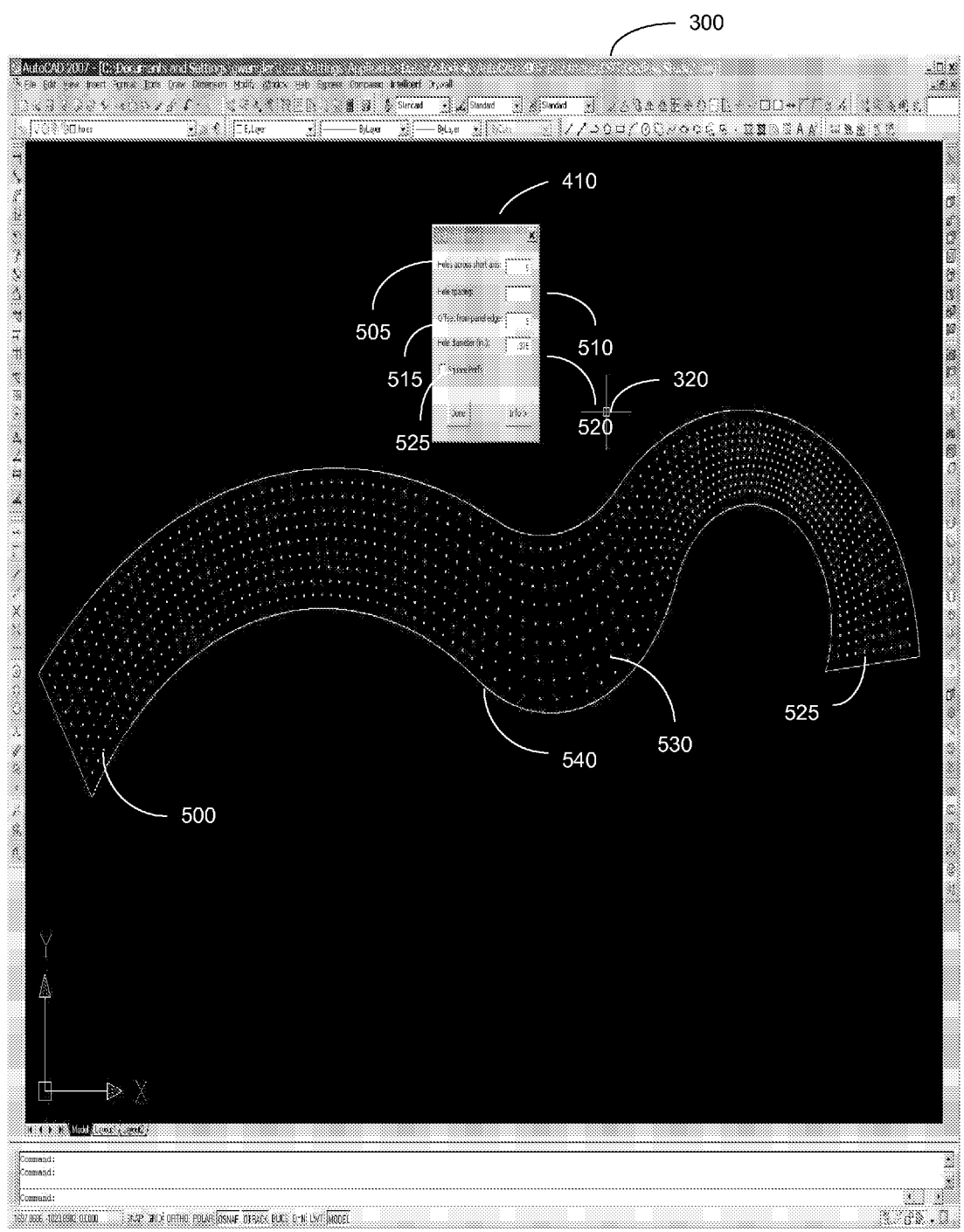
FIG. 5 is an exemplary user interface, in accordance with an embodiment of the invention illustrating updating a perforation pattern using a perforation software application.

FIG. 5 illustrates the manner in which the perforation application updates the perforation pattern when changing pattern parameters. The perforation application updates the perforation pattern from FIG. 4 to the pattern 500 depicted in FIG. 5 by changing several pattern parameters. Examining the perforation application module dialog box 410, the number of holes along the short axis has been decreased from eleven to nine (415, 505), the panel edge offset is modified from 1.5 to 3 (420, 515), and the hole diameter has been changed from 0.5 to 0.375 (430, 520). The updated perforation pattern 500 continues to create an aesthetically pleasing array that fits the ceiling shape with no odd spacing 525. In addition, the application creates the radial pattern where each radial is parallel to each other and the ceiling edge segments 500. Further, the pattern located the perforations to be closely square in the center of the ceiling that contributes to the pleasing aesthetic 530.

Figure 6:
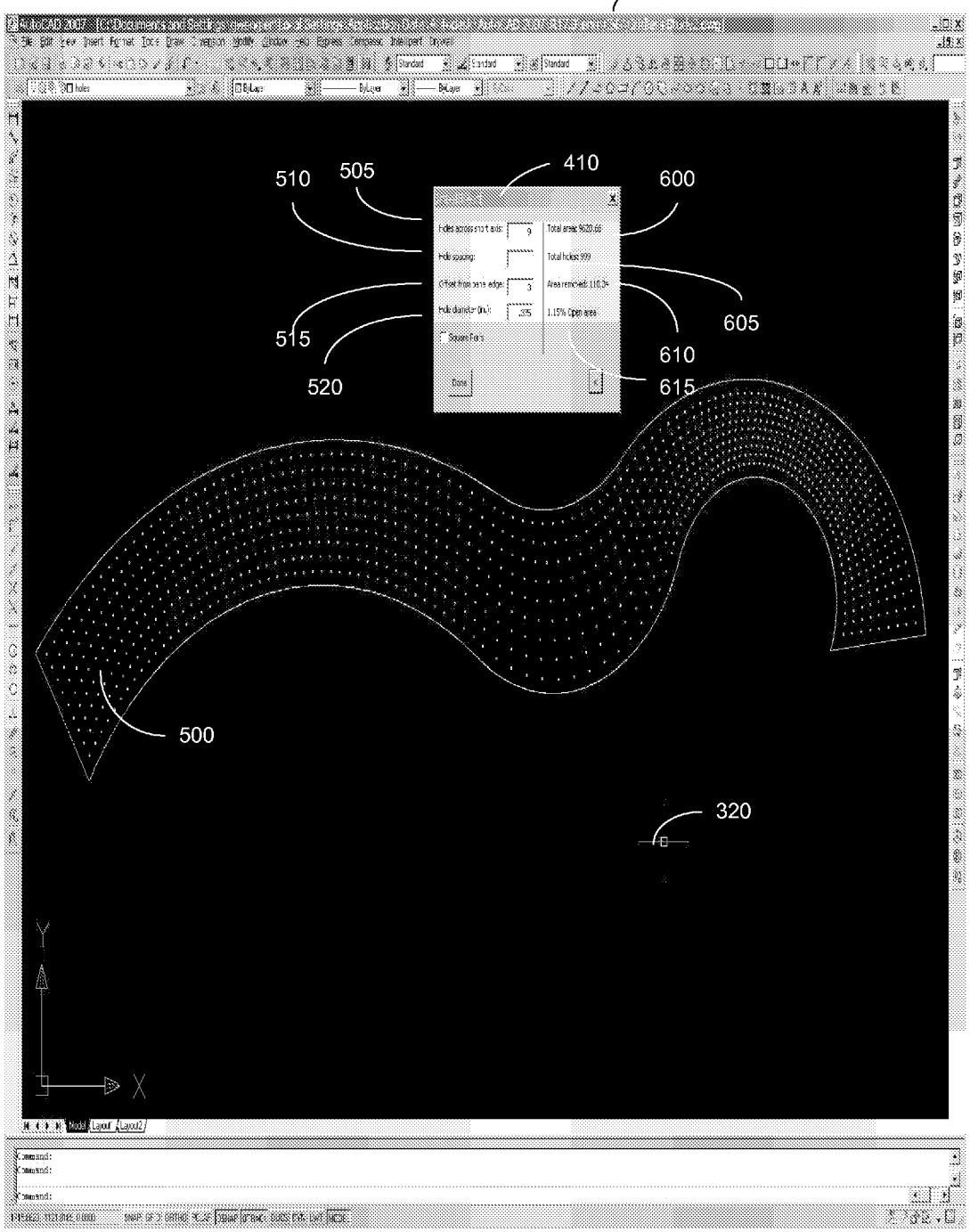
FIG. 6 is an exemplary user interface, in accordance with an embodiment of the invention illustrating a perforation software application reporting pattern information.
Figure 7:
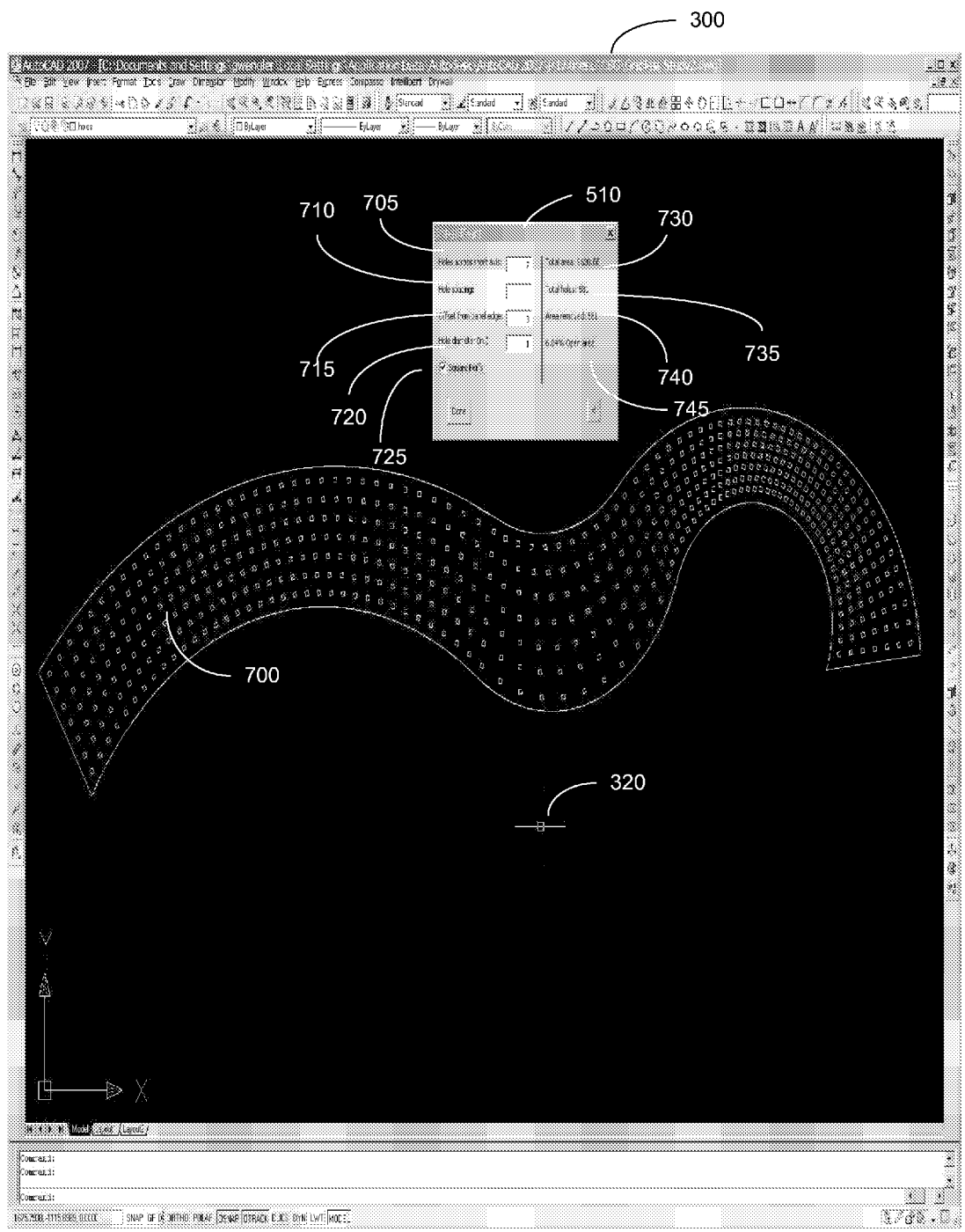
FIG. 7 is an exemplary user interface, in accordance with an embodiment of the invention illustrating updating a perforation pattern using a perforation software application.

FIG. 6 illustrates characteristic information that is reported by the "Info" tab (See FIG. 5) of the dialog box 410. Note, the invention is not limited to this set of characteristic information. The perforation application reports that the perforation pattern occupies a total area 9620.66 (600), contains a total number of holes of 999 (605), area removed of 110.34 (610), and the percentage of open area of 1.15% (615). FIG. 7 illustrates the perforation application updating a perforation pattern when a user changes the perforation parameters and that it reports different results. The perforation pattern 700 now contains seven holes 705 across the short axis of the ceiling shape. In addition, the perforation pattern has panel edge offset of 3 (715), hole diameter of 1 (720), and contains square perforations 725. The perforation application dialog box 410 reports that the perforation pattern 700 contains a total area of 9620.66 (730), total holes of 581 (735), area removed of 581 (740) and percentage of open area of 6.04% (745).

Figure 8:
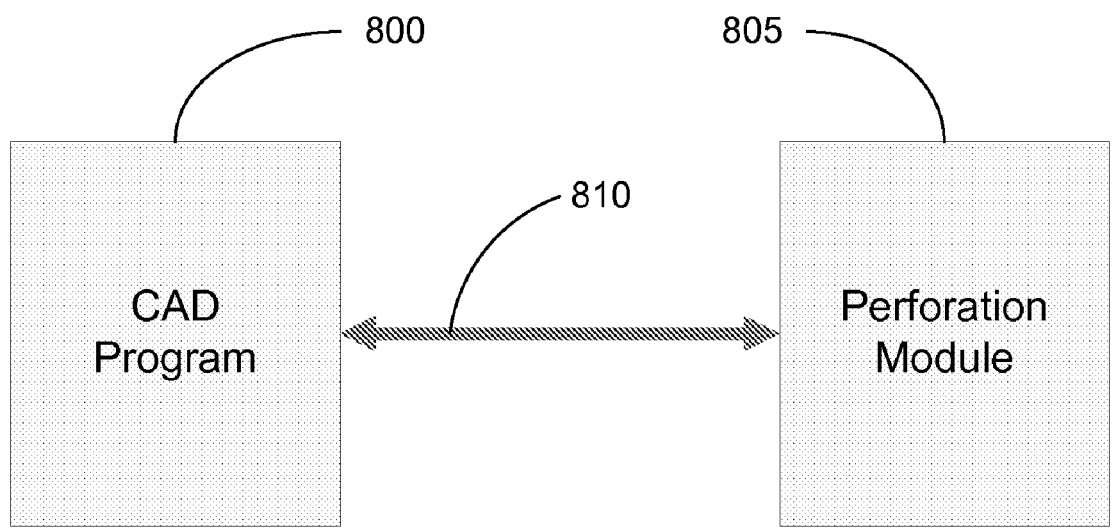
FIG. 8 is a functional block diagram, in accordance with an embodiment of the invention illustrating the interaction between a CAD program and a perforation software application.

FIG. 8 is a functional block diagram, in accordance with an embodiment of the invention. Data is transmitted and received between a computer aided drawing (CAD) program 800 and the perforation application module 805 through a communication link 810. Communication link 810 is typically a logical interface established between these software applications, which permits the exchange of data.

Figure 9:
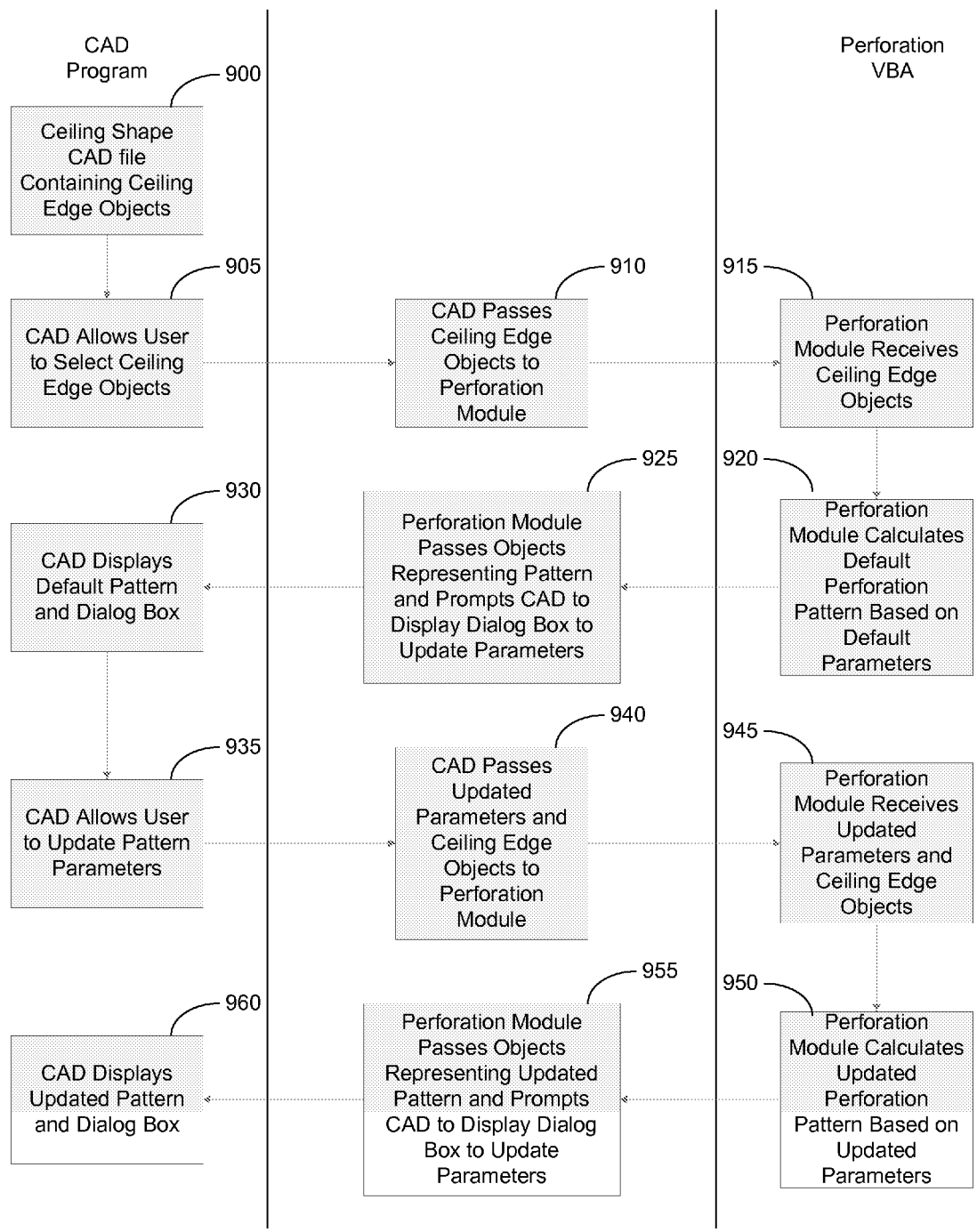
FIG. 9 is a flow diagram illustrating steps in a method of an exemplary embodiment of the invention illustrating laying out and updating a perforation pattern using a software application and a CAD program.

FIG. 9 is a flow diagram illustrating another embodiment of the invention. This flow diagram assumes that both the CAD application and the perforation module are executing on a computer at the same time. At step 900, a user instructs a CAD application to display the program containing the ceiling shape. The CAD application and perforation application module thereafter cooperatively allow a user to select ceiling edge segment objects, step 905. At step 910, the CAD application passes the ceiling edge objects to the perforation application module, which is monitoring the selection of a ceiling edge. The perforation application thereafter receives the ceiling edge segment objects from the CAD application, step 915. At step 920, the perforation application module calculates a default perforation pattern based on default perforation parameters. The perforation application module passes objects representing the default perforation pattern to the CAD application, step 925, which then prompts the CAD application to display a dialog box allowing a user to update perforation pattern parameters. At step 930, the CAD application receives and displays the objects representing the default perforation pattern onto the ceiling shape.

The CAD application further displays a dialog box (based on prompting from the perforation application) allowing a user to update perforation parameters. Further, the dialog box allows the user to access pattern information such as total area, total number of holes, area removed, and percentage of open area. A user may then update perforation parameters, step 935. At step 940, the CAD application passes ceiling edge objects and updated perforation parameters, and at step 945, the perforation application module receives the ceiling edge segment objects and the updated perforation parameters. The perforation application module thereafter calculates an updated perforation pattern based on the updated perforation parameters, step 950. The perforation application module also passes CAD objects representing an updated perforation pattern, step 955, and prompts the CAD application to display a dialog box to allow the user to update perforation parameters. At step 960, CAD displays the updated perforation pattern and displays the dialog box allowing a user to update perforation parameters. Further, the dialog box allows the user to access pattern information such as total area, total number of holes, area removed, and percentage of open area.

Figure 10:
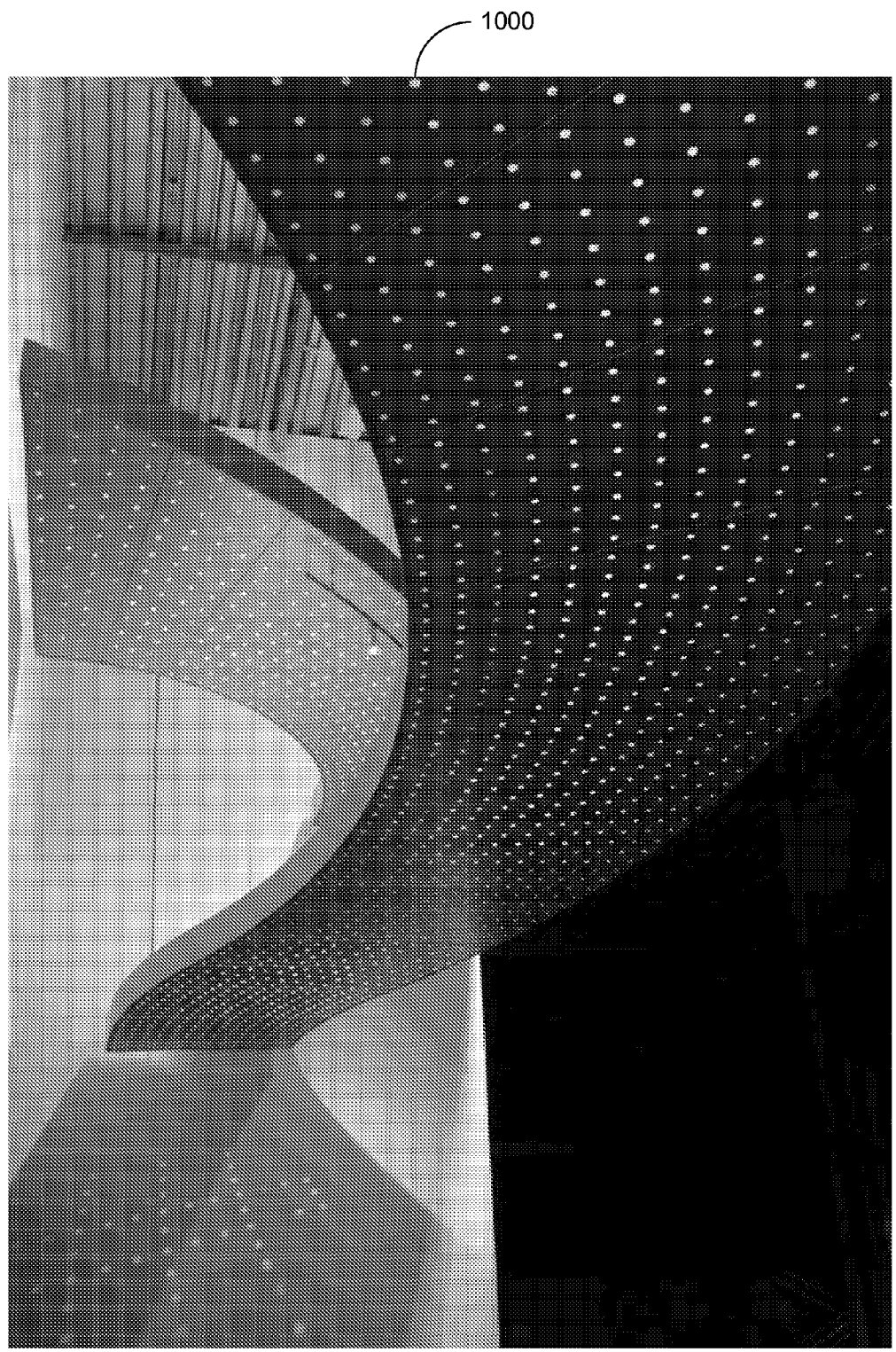
FIG. 10 is an exemplary ceiling panel system that contains a perforation pattern that can be laid out using the perforation application.

FIG. 10 is an exemplary ceiling panel system that contains a perforation pattern that can be laid out using the perforation application. For example, an architect designing a ceiling panel system 1000 sends the perforation designer a CAD drawing of the ceiling shape. The perforation designer uses the perforation application to lay out a perforation pattern. FIGS. 11A-B illustrate exemplary perforation patterns (1100, and 1105) that can be laid out by the perforation application. The perforation designer sends the CAD computer file containing the ceiling shape and perforation panel to a manufacturing facility. The ceiling panel manufacturers convert the CAD file into instructions to drive manufacturing equipment, such as computer numerical control (CNC) machine tools to produce the perforation patterns on metal ceiling panels.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A computerized method for generating perforation patterns on building panels comprising:
    displaying a drawing of a building panel with a computer aided design (CAD) program running on a computer;
    executing on the computer a perforation program that exchanges data with the CAD program and receives user-input perforation pattern parameters;
    selecting through a computer input device a first edge and a second edge of the displayed building panel;
    displaying a perforation pattern automatically calculated by the perforation program after the second edge of the displayed building panel is selected;
    adjusting the perforation pattern display based on a user change to the perforation pattern parameters; and
    displaying characteristic information regarding the perforation pattern.

2. The method according to claim 1, wherein the perforation pattern parameters are selected from a group consisting of holes across an axis, hole spacing, offset from panel edge, hole diameter, hole shape.

3. The method according to claim 1, wherein the characteristic information is selected from a group consisting of total area, total number of holes, area removed, and percentage of open area.

4. The method according to claim 1, wherein the perforation pattern is automatically calculated by reference to a computer-determined geometric center of the displayed edges.

5. The method according to claim 1, further comprising the step of saving a CAD drawing file including the displayed perforation pattern.

6. The method according to claim 5, further comprising the step of generating a computer numerical control (CNC) file from the saved CAD drawing file.

7. The method according to claim 5, further comprising the step of converting the CAD drawing file into a computer file capable of controlling a computer-controlled machine tool.

8. The method according to claim 7, further comprising the step of controlling the machine tool with the computer file to perforate the building panel in accordance with the perforation pattern saved on the CAD drawing file.

9. The method of claim 1 wherein the building panel is a metal ceiling panel.

10. A system for generating perforation patterns on a metal ceiling panel comprising:
    a computer aided design (CAD) program capable of displaying a CAD drawing representing a ceiling panel shape;
    a perforation software program capable of calculating and laying out perforation patterns on a computer aided drawing of the panel shape;
    a graphical user interface capable of (a) querying a user for perforation pattern parameters for the panel shape, (b) receiving input from the user indicative of a desired perforation pattern; and (c) displaying information characteristic of the desired perforation pattern; and
    a computer for executing the CAD program, the graphical user interface and the perforation software program.

11. The system according to claim 10, wherein the perforation software program exchanges data with the CAD program to calculate and lay out perforation patterns on the CAD drawing of the panel.

12. The system according to claim 10, wherein the perforation pattern parameters are selected from a group consisting of holes across a short axis, hole spacing, offset from panel edge, hole diameter, and hole shape.

13. The system according to claim 10, wherein the characteristic information is selected from a group consisting of total area, total number of holes, area removed, and percentage of open area.

14. The system according to claim 10, wherein the perforation software program calculates a geometric center of the desired perforation pattern by intersecting connecting lines between a starting point and an endpoint of each segment of edges of the panel.

15. The system according to claim 10, wherein the perforation software program calculates the desired perforation pattern to be located in a center of the panel.

16. The system according to claim 10, further including a computer-controlled machine tool capable of removing material from the panel in accordance with the desired perforation pattern established by the perforation software program.

17. An apparatus comprising:
a processor; a display coupled to the processor;
a user interface selection device coupled to the processor; and a storage device, coupled to the processor, comprising instructions, executable by the processor, for performing steps of:
displaying on the display a representation of a metal panel without any perforation pattern;
receiving an indication via the user interface selection device of a first selected edge of the panel;
receiving an indication via the user interface selection device of a second selected edge of the panel;
determining the geometric center of the panel in response to selection of the first and second panel edges;
accepting user input defining perforation parameters for the panel;
determining the layout of a user-defined perforation pattern on the panel; and
displaying on a display a representation of the panel with the perforation pattern.

18. The apparatus according to claim 17, wherein the perforation parameters are selected from a group consisting of holes across an axis, hole spacing, offset from panel edge, hole diameter, and hole shape.

19. The apparatus according to claim 17, further comprising instructions, executable by the processor, for performing the steps of displaying on a display information characteristic of the perforation pattern.

20. The apparatus according to claim 19, wherein the characteristic information is selected from a group consisting of total area, total number of holes, area removed, and percentage of open area.

* * * * *